(12) United States Patent
Lim et al.

(10) Patent No.: US 8,664,755 B2
(45) Date of Patent: Mar. 4, 2014

(54) POWER MODULE PACKAGE AND METHOD FOR MANUFACTURING THE SAME

(75) Inventors: Chang Hyun Lim, Seoul (KR); Young Ki Lee, Gyunggi-do (KR); Kwang Soo Kim, Gyunggi-do (KR); Seog Moon Choi, Seoul (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 0 days.

(21) Appl. No.: 13/247,603

(22) Filed: Sep. 28, 2011

(65) Prior Publication Data

US 2013/0009290 A1    Jan. 10, 2013

(30) Foreign Application Priority Data

Jul. 4, 2011   (KR) .................. 10-2011-0066046

(51) Int. Cl.
*H01L 23/495*     (2006.01)
*H01L 21/00*      (2006.01)

(52) U.S. Cl.
USPC ........... 257/676; 257/685; 257/686; 257/692; 257/696; 257/E25.005; 257/E25.006; 257/E25.013; 257/E21.705; 438/109; 438/123

(58) Field of Classification Search
USPC .......... 257/777, 678–733, E23.001–E23.194, 257/676, E25.005, E25.006, E25.012, 257/E25.013, E25.015, E25.016, E25.02, 257/E25.021, E25.022, E25.026, E25.027, 257/E23.085, E21.705; 438/15, 26, 51, 64, 438/106, 124–127, 109, 111, 112, 123, 438/FOR. 368, FOR. 377, FOR. 380, 438/FOR. 426
See application file for complete search history.

(56) References Cited

U.S. PATENT DOCUMENTS

| | | | | |
|---|---|---|---|---|
| 5,403,782 | A * | 4/1995 | Dixon et al. | 29/827 |
| 5,703,399 | A * | 12/1997 | Majumdar et al. | 257/723 |
| 6,583,503 | B2 * | 6/2003 | Akram et al. | 257/686 |
| 6,972,479 | B2 | 12/2005 | Chen et al. | |
| 7,550,834 | B2 * | 6/2009 | Yu et al. | 257/686 |

FOREIGN PATENT DOCUMENTS

| | | |
|---|---|---|
| JP | 07-161899 | 6/1995 |
| JP | 2004-349400 | 12/2004 |
| KR | 10-1999-0047736 A | 7/1999 |

OTHER PUBLICATIONS

Office Action dated Aug. 30, 2012 for related KR App. No. 10-2011-0066046, and its English summary.
Office Action dated Jan. 25, 2013 for related Korean Patent Application No. 10-2011-0066045 and its English summary provided by the clients.
Applicant-provided Office Action issued for related Japanese Patent Application No. 2011-206316, dated Apr. 30, 2013, and its English summary, also provided by the Applicant.

* cited by examiner

*Primary Examiner* — Jasmine Clark
(74) *Attorney, Agent, or Firm* — Ladas & Parry, LLP

(57) ABSTRACT

Disclosed herein is a power module package including: a first substrate; a second substrate having a pad for connection to the first substrate formed on one side or both sides of one surface thereof and having external connection terminals for connection to the outside formed on the other surface thereof; and a lead frame having one end bonded to the first substrate and the other end bonded to the pad of the second substrate to thereby vertically connect the first and second substrates to each other.

21 Claims, 8 Drawing Sheets

POWER MODULE PACKAGE AND METHOD FOR MANUFACTURING THE SAME

CROSS REFERENCE TO RELATED APPLICATION

This application claims the benefit of Korean Patent Application No. 10-2011-0066046, filed on Jul. 4, 2011, entitled "Power Module Package And Method For Manufacturing The Same", which is hereby incorporated by reference in its entirety into this application.

BACKGROUND OF THE INVENTION

1. Technical Field

The present invention relates to a power module package and a method for manufacturing the same.

2. Description of the Prior Art

In accordance with a global increase in energy usage, the use of a power conversion device such as an inverter in fields such as home appliances, industrial products, or the like has increased in order to effectively use energy and protect environment.

An intelligent power module (IPM) that has been prominent in accordance with the increase in the use of the inverter is a core component performing direct current (DC) rectification and alternate current (AC) conversion in the inverter and may be used in home appliances such as a refrigerator, a washing machine, an air conditioner, industrial applications such as an industrial motor, or the like, and the next generation applications such as a hybrid electric vehicle (HEV), an electric vehicle (EV), or the like.

Generally, high heat is generated during a power conversion process. When the generated heat is not effectively removed, performances of the module and the entire system may be deteriorated or damages thereof may be caused. Furthermore, in accordance with the recent trend toward multi-function and small-sized components, the IPM needs to have a multi-function and a small size. Therefore, structure improvement for allowing IPM to have the multi-function and the small size and effective radiation of heat generated due to the above-mentioned structure improvement have been important.

In the first scheme among the schemes according to the prior art, an IPM implemented by a scheme in which a power device and a control device are separately positioned on separated lead frames radiates heat only through the lead frame. Therefore, it is difficult to apply the first scheme to applications having a high heat generation amount due to a limitation in heat radiation capability of the lead frame. In addition, the structure in which a power unit and a control unit are disposed is mainly to perform thermal separation, and has a difficulty in miniaturizing the entire component.

In the second scheme according to the prior art, an IPM uses a substrate made of a metal having excellent heat radiation characteristics. In the case of this scheme, even the control device that does not generate high heat is positioned on an expensive heat radiation substrate, thereby causing an increase in a size of a module itself and increase in a cost of the entire module due to the expensive heat radiation substrate. In addition, since components having multiple functions are positioned on a single plane, there is a limitation in a degree of freedom in design.

SUMMARY OF THE INVENTION

The present invention has been made in an effort to provide a power module package capable of miniaturizing the entire component, and a method for manufacturing the same.

Further, the present invention has been made in an effort to provide a power module package capable of reducing a product cost by reducing an area of a heat radiation substrate that is expensive as compared to a general substrate, and a method for manufacturing the same.

Further, the present invention has been made in an effort to provide a power module package capable of reducing a product cost by reducing the use of a lead frame for connection to the outside, and a method for manufacturing the same.

According to a first preferred embodiment of the present invention, there is provided a power module package including: a first substrate; a second substrate having a pad for connection to the first substrate formed on one side or both sides of one surface thereof and having external connection terminals for connection to the outside formed on the other surface thereof; and a lead frame having one end bonded to the first substrate and the other end bonded to the pad of the second substrate to thereby vertically connect the first and second substrates to each other.

The other end of the lead frame may be bonded to the pad formed on one side of one surface of the second substrate.

The other ends of the lead frames may be bonded to the pads formed on both sides of one surface of the second substrate.

The second substrate may further include vias formed so as to be electrically connected to the external connection terminals.

The other end of the lead frame bonded to the pad of the second substrate may have a down-set form, and the other end of the lead frame and the pad of the second substrate may be bonded to each other through soldering.

The power module package may further include first semiconductor chips mounted on the lead frame bonded to the first substrate and second semiconductor chips mounted on the second substrate, wherein the first semiconductor chip is a power device, and the second semiconductor chip is a control device for controlling the driving of the power device.

The first substrate may be a metal substrate having anodized layers, and the second substrate may be a printed circuit board (PCB).

The power module package may further include a sealing resin formed to enclose from a side of the first substrate to a side of the second substrate, wherein the first and second substrates are connected to each other by the lead frame.

According to a second preferred embodiment of the present invention, there is provided a method for manufacturing a power module package, the method including: preparing a first substrate to which one end of lead frame is bonded; preparing a second substrate having a pad for connection to the first substrate formed on one side or both sides of one surface thereof and having external connection terminals for connection to the outside formed on the other surface thereof; and vertically connecting the first and second substrates to each other by bonding the other end of the lead frame and the pad of the second substrate to each other.

The vertically connecting of the first and second substrates may be performed by bonding the other end of the lead frame and the pad formed on one side of the second substrate to each other.

The vertically connecting of the first and second substrates may be performed by bonding the other end of the lead frame and the pads formed on both sides of the second substrate to each other.

The preparing of the second substrate may further include forming vias electrically connected to the external connection terminals in the second substrate.

The method may further include, after the preparing of the first substrate, mounting first semiconductor chips on the lead frame bonded to the first substrate.

The method may further include, after the preparing of the second substrate, mounting second semiconductor chips on an upper portion of the second substrate.

The method may further include, after the vertically connecting of the first and second substrates, forming a sealing resin enclosing from a side of the first substrate to a side of the second substrate.

The first substrate may be a metal substrate having anodized layers, and the second substrate may be a PCB.

DESCRIPTION OF THE PREFERRED EMBODIMENTS

Figure 1:
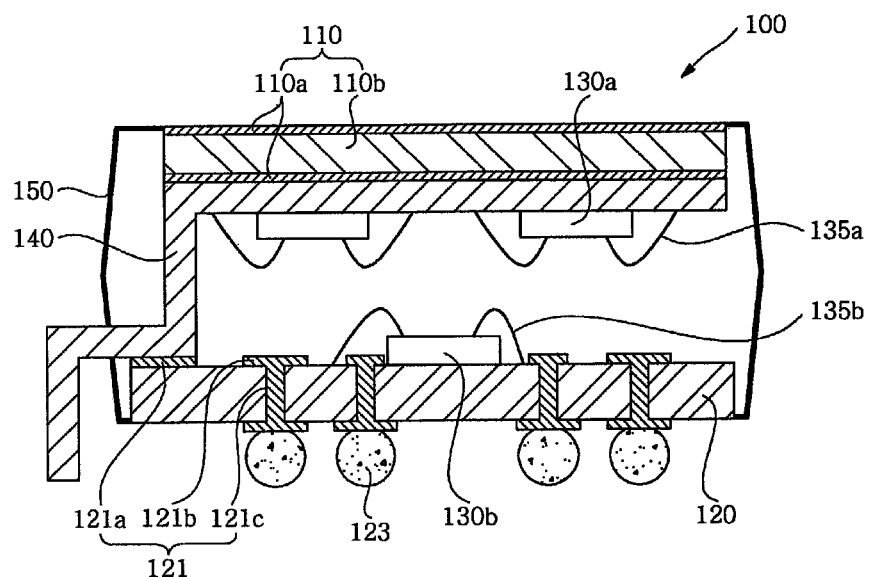
FIG. 1 is a cross-sectional view showing a structure of a power module package according to a first preferred embodiment of the present invention.

Various features and advantages of the present invention will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from preferred embodiments and the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one element from another element, and the elements are not defined by the above terms.

Hereinafter, preferred embodiments of the present invention will be described in detail with reference to the accompanying drawings.

Power Module Package

First Preferred Embodiment

FIG. 1 is a cross-sectional view showing a structure of a power module package according to a first preferred embodiment of the present invention.

Referring to FIG. 1, a power module package 100 according to the present embodiment includes a first substrate 110, a second substrate 120, and a lead frame 140 connecting the first and second substrate 110 and 120 to each other.

The first substrate 110 is a substrate having first semiconductor chips 130a mounted thereon. According to the present embodiment, the first substrate 110 may be a metal substrate 110b having anodized layers 110a but is not specifically limited thereto. The first substrate 110 may include, for example, a printed circuit board (PCB), a ceramic substrate, and a directed bonded copper (DBC) substrate.

As a material of the metal substrate 110b, for example, aluminum (Al) which is a metal material capable of being easily obtained at a relatively low cost and has significantly excellent heat transfer characteristics, or an alloy thereof may be used. Since the metal substrate 110b has significantly excellent heat transfer characteristics to thereby serve as a heat radiation member radiating heat discharged from the first semiconductor chips 130a, it does not require a separate heat radiation member.

In addition, the anodized layer 110a, which is formed by immersing the metal substrate 110b made of aluminum or an alloy thereof in an electrolyte solution such as boric acid, phosphoric acid, sulfuric acid, chromic acid, or the like, and then applying an anode to the metal substrate 110b and applying a cathode to the electrolyte solution, has insulation capability and relative high heat transfer characteristics of about 10 to 30 W/mk.

Since the aluminum or the alloy thereof is used as a material of the metal substrate 110b in the present embodiment, an aluminum anodized layer ($Al_2O_3$) may be formed.

The anodized layer 110a has an insulation property, thereby making it possible to allow a circuit layer to be formed on the first substrate 110. In addition, the anodized layer 110a is formed at a thickness thinner than that of a general insulating layer to reduce a distance between the metal substrate 110b and the semiconductor chip 130a, thereby making it possible to thin the power module package simultaneously with further improving heat radiation performance.

As shown in FIG. 1, one end of the lead frame 140 may be bonded onto the above-mentioned first substrate 110, and the first semiconductor chips 130a may be mounted on the lead frame 140 bonded onto the first substrate 110.

Here, the lead frame 140 may be generally made of copper having high thermal conductivity but is not limited thereto.

Although not shown in FIG. 1, the first semiconductor chips 130a may be adhered to the lead frame 140 using an adhesive member (not shown), which may be conductive or non-conductive.

For example, the adhesive member may be formed through plating or be a conductive paste or a conductive tape. In addition, the adhesive member may be a solder, metal epoxy, metal paste, resin based epoxy, or an adhesive tape having excellent heat resistance.

As the adhesive tape that may be used as the adhesive member, for example, the commercialized and known high temperature tape such as a glass tape, a silicon tape, a Teflon tape, a stainless foil tape, a ceramic tape, or the like, may be used. In addition, the adhesive member may be formed by mixing the above-mentioned materials but is not specifically limited thereto.

Here, as the first semiconductor chip 130a, a silicon controlled rectifier (SCR), a power transistor, an insulated gate bipolar transistor (IGBT), a metal oxide semiconductor (MOS) transistor, a power rectifier, a power regulator, an inverter, a converter, or a high power semiconductor chip or diode formed of a combination thereof may be used.

As described above, the first semiconductor chip 130a mounted on the lead frame 140 may be electrically connected to the lead frame 140 through wire 135a bonding.

Here, the wire 135a bonding process may be performed by ball bonding, wedge bonding, and stitch bonding well known in the art.

Meanwhile, although FIG. 1 shows as if both of two first semiconductor chips 130a mounted on the lead frame 140 are wire 135a bonded to the same lead frame 140 because it is shown as a cross-sectional view, it will be obvious to those skilled in the art that the respective first semiconductor chips 130a are wire 135a bonded to different lead frames 140.

According to the present embodiment, the second substrate 120 may be a printed circuit board (PCB), and second semiconductor chips 130b may be mounted on the second substrate 120. In addition, although FIG. 1 shows that the second substrate 120 is a single-layer printed circuit board for simplification of the drawing, the second substrate 120 may be a single layer or multi-layer printed circuit board.

According to the present embodiment, the second substrate 120 may be provided with a circuit layer 121 including a connection pad 121a, vias 121c, and circuit patterns 121b.

The circuit layer 121 may be an electro plating layer or an electroless plating layer but is not specifically limited thereto.

In addition, the circuit layer 121 may be made of a conductive material such as a metal, for example, aluminum, an aluminum alloy, copper, a copper alloy, or a combination thereof, nickel, gold, or an alloy thereof but is not specifically limited thereto.

Similar to the first semiconductor chip 130a, the second semiconductor chip 130b may also be mounted on the second substrate 120 using an adhesive member (not shown). The second semiconductor chip 130b mounted on the second substrate 120 may be electrically connected to the circuit pattern 121b through the wire 135b bonding.

The connection pad 121a of the circuit layer 121 formed in the second substrate 120 has one end bonded to the other end of the lead frame 140 bonded to the first substrate 110, as shown in FIG. 1. Here, the connection pad 121a and the other end of the lead frame 140 may be bonded to each other through soldering.

According to the present embodiment, the connection pad 121a is formed only on one side of an upper surface of the second substrate 120, and one end of a single lead frame 140 is bonded to the entire upper surface of the first substrate 110 and the other end thereof is bonded to the connection pad 121a formed on one side of the upper surface of the second substrate 120 as shown in the cross-sectional view of FIG. 1.

Although only a single lead frame 140 is shown in the cross-sectional view of FIG. 1, a plurality of lead frames 140 may be bonded between the first and second substrates 110 and 120 in a form as shown in FIG. 1.

That is, the other ends of the plurality of lead frames 140 bonded to the entire upper surface of the first substrate 110 are bonded to the connection pad 121a formed on one side of the upper surface of the second substrate 120, such that the first and second substrates 110 and 120 may be connected to each other in a vertical form as shown in FIG. 1.

In addition, the other end of the lead frame 140 contacting the connection pad 121a of the second substrate 120 may have a down-set form but is not specifically limited thereto.

In addition, as shown in FIG. 1, the second substrate 120 may further include external connection terminals 123 formed on the circuit patterns 121b connected to the vias 121c.

The external connection terminal 123 is a member for electrically connecting a main substrate (not shown) on which the power module package 100 according to the present embodiment is to be mounted and the second substrate 120 to each other. According to the present embodiment, the second substrate 120 may be connected to the outside through the vias 121c and the external connection terminals 123 without a separate lead frame bonded to the second substrate 120.

Here, the external connection terminal 123 may be a solder ball but is not specifically limited thereto.

As described above, according to the present embodiment, the separate lead frame for connecting the second substrate 120 to the outside is not required to reduce the use of the lead frame, thereby making it possible to reduce a product cost.

As described above, the second substrate 120 may include the second semiconductor chips 130b mounted thereon. Here, the second semiconductor chip 130b may include a low power semiconductor chip for controlling the above-mentioned high power semiconductor chip, for example, a control device for controlling the power device.

That is, the second substrate 120 on which the low power semiconductor chip more vulnerable to heat and electricity as compared to the high power semiconductor chip is mounted is manufactured separately from the first substrate 110 on which the high power semiconductor chip is mounted, such that the first and second substrates are disposed and coupled to each other in a three dimensional structure, thereby making it possible to prevent heat generated from the high power semiconductor chip from having an influence on the low power semiconductor chip.

In addition, only the high power semiconductor chip is mounted on the first substrate, which is a heat radiation substrate, and the lower power semiconductor chip is mounted on the second substrate, which is a printed circuit board, to reduce a size of the used heat radiation substrate, thereby making it possible to reduce a cost required for manufacturing a product.

In addition, a power unit and a control unit are separately manufactured, respectively, thereby making it possible to improve a degree of freedom in design of the circuit as compared to a case in which both of the power unit and the control unit are integrated on a single substrate.

In addition, as shown in FIG. 1, the power module package according to the present embodiment may further include a sealing resin 150 enclosing from a side of the first substrate 110 to a side of the second substrate 120, wherein the first and second substrates 110 and 120 are connected to each other by the lead frame 140.

The sealing resin 150 is to protect the wires 135a and 135b and the first and second semiconductor chips 130a and 130b from an external environment. As a material of the sealing resin, an epoxy molding compound (EMC), or the like, may be used. However, the material of the sealing resin is not specifically limited thereto.

Second Preferred Embodiment

Figure 2:
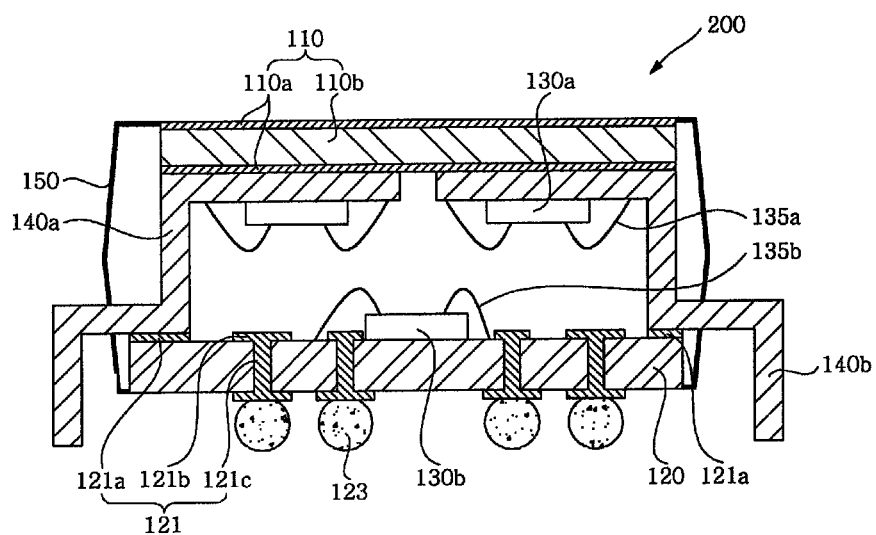
FIG. 2 is a cross-sectional view showing a structure of a power module package according to a second preferred embodiment of the present invention.

FIG. 2 is a cross-sectional view showing a structure of a power module package according to a second preferred embodiment of the present invention.

In the present embodiment, a description of components overlapped with the components described in the first preferred embodiment will be omitted. In addition, the same reference numerals will be used to describe the same components as the components described in the first preferred embodiment.

Referring to FIG. 2, a power module package 200 according to the present embodiment includes a first substrate 110, a second substrate 120, and lead frames 140a and 140b connecting the first and second substrate 110 and 120 to each other.

According to the present embodiment, unlike the structure of the first preferred embodiment, one ends of two lead frames 140a and 140b are bonded to the upper surface of the first substrate 110 while being spaced apart from each other, and the other ends of the lead frames 140a and 140b are, respectively, bonded to connections pads 121a formed on both sides of the upper surface of the second substrate 120 as shown in the cross-sectional view of FIG. 2.

That is, one ends of each of two lead frames 140a and 140b are bonded to the upper surface of the first substrate 110, and the other ends of each of two lead frames 140a and 140b each having one end bonded to the upper surface of the first substrate 110 are bonded to the connection pads 121a formed on both sides of the upper surface of the second substrate 120.

Here, the other ends of each of the lead frames 140a and 140b may have a down-set form but are not specifically limited thereto. In addition, although FIG. 2 shows a form in which one ends of two lead frames 140a and 140b are bonded to the upper surface of the first substrate 110 while being spaced apart from each other, one ends of two lead frames 140a and 140b may be bonded to the upper surface of the first substrate 110 in a state in which they are connected to each other.

In addition, although a pair of lead frames 140a and 140b on the left and the right is shown in the cross-sectional view of FIG. 2, it is obvious that several pairs of lead frames 140 are bonded to the first and second substrates 110 and 120 in a form as shown in FIG. 1.

As described above, both sides, that is, the lefts and right sides, of the first and second substrates 110 and 120 are coupled to each other by the pair of lead frames 140a and 140b to further improve mechanical stability as compared to the power module package 100 according to the first preferred embodiment described above, thereby making it possible to stably perform a process.

Method for Manufacturing Power Module Package

First Preferred Embodiment

FIGS. 3 to 8 are process cross-sectional views sequentially showing a method for manufacturing a power module package according to a first preferred embodiment of the present invention.

Figure 3:
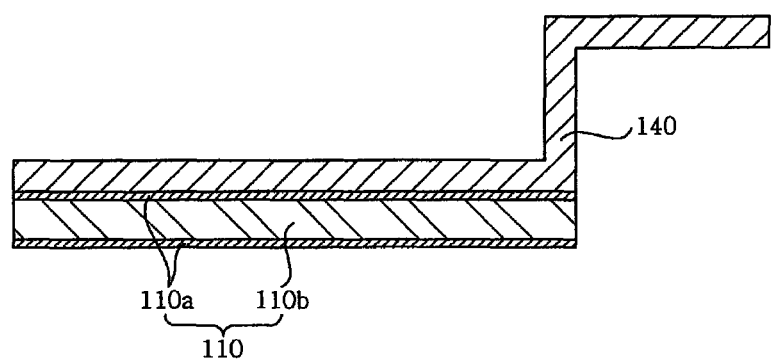
FIGS. 3 to 8 are process cross-sectional views sequentially showing a method for manufacturing a power module package according to a first preferred embodiment of the present invention.

First, referring to FIG. 3, a first substrate 110 having a lead frame 140 bonded thereto is prepared.

Here, the first substrate 110 is a substrate having first semiconductor chips 130a mounted thereon. According to the present embodiment, the first substrate 110 may be a metal substrate 110 having anodized layers 110a but is not specifically limited thereto. The first substrate 110 may include, for example, a printed circuit board (PCB), a ceramic substrate, and a directed bonded copper (DBC) substrate.

As a material of the metal substrate 110b, for example, aluminum (Al) which is a metal material capable of being easily obtained at a relatively low cost and has significantly excellent heat transfer characteristics, or an alloy thereof may be used. Since the metal substrate 110b has significantly excellent heat transfer characteristics to thereby serve as a heat radiation member radiating heat discharged from the first semiconductor chips 130a, it does not require a separate heat radiation member.

In addition, the anodized layer 110a, which is formed by immersing the metal substrate 110b made of aluminum or an alloy thereof in an electrolyte solution such as boric acid, phosphoric acid, sulfuric acid, chromic acid, or the like, and then applying an anode to the metal substrate 110b and applying a cathode to the electrolyte solution, has insulation capability and relative high heat transfer characteristics of about 10 to 30 W/mk.

Since the aluminum or the alloy thereof is used as a material of the metal substrate 110b in the present embodiment, an aluminum anodized layer ($Al_2O_3$) may be formed.

The anodized layer 110a has an insulation property, thereby making it possible to allow a circuit layer to be formed on the first substrate 110. In addition, the anodized layer 110a is formed at a thickness thinner than that of a general insulating layer to reduce a distance between the metal substrate 110b and the semiconductor chip 130a, thereby making it possible to thin the power module package simultaneously with further improving heat radiation performance.

Here, the lead frame 140 may be bonded to the entire upper surface of the first substrate 110 but is not specifically limited thereto. One end of the lead frame 140 may be bonded to the first substrate 110.

In addition, the other end of the lead frame protruded from the first substrate 110 may have a down-set form but is not specifically limited thereto.

Figure 4:
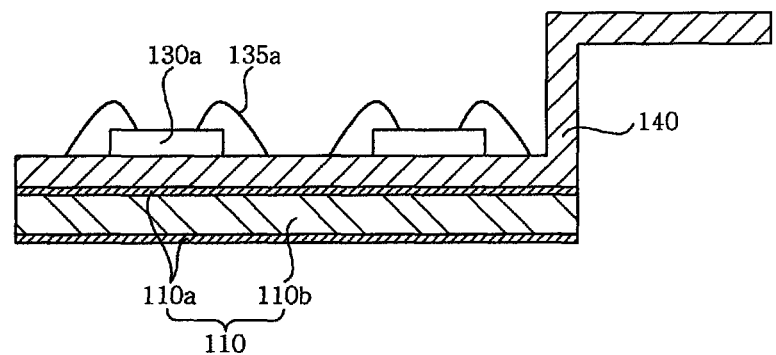

Next, referring to FIG. 4, the first semiconductor chips 130a are mounted on the lead frame 140 bonded to the first substrate 110 and the mounted first semiconductor chips 130a and the lead frame 140 are then wire 135a bonded to each other.

According to the present embodiment, as the first semiconductor chip 130a, a silicon controlled rectifier (SCR), a power transistor, an insulated gate bipolar transistor (IGBT), a metal oxide semiconductor (MOS) transistor, a power rectifier, a power regulator, an inverter, a converter, or a high power semiconductor chip or diode formed of a combination thereof may be used.

Although not shown in FIG. 4, the first semiconductor chips 130a may be adhered to the lead frame 140 using an adhesive member (not shown), which may be conductive or non-conductive.

For example, the adhesive member may be formed through plating or be a conductive paste or a conductive tape. In addition, the adhesive member may be a solder, metal epoxy, metal paste, resin based epoxy, or an adhesive tape having excellent heat resistance.

As the adhesive tape that may be used as the adhesive member, for example, the commercialized and known high temperature tape such as a glass tape, a silicon tape, a Teflon tape, a stainless foil tape, a ceramic tape, or the like, may be used. In addition, the adhesive member may be formed by mixing the above-mentioned materials but is not specifically limited thereto.

Here, a process of connecting the first semiconductor chips 130a and the lead frame 140 to each other using the wire 135a may be performed by ball bonding, wedge bonding, and stitch bonding well known in the art.

Meanwhile, although FIG. 4 shows as if two first semiconductor chips 130a are mounted on a single lead frame 140 and both of two first semiconductor chips 130a are wire 135a bonded to the same lead frame 140, it will be obvious that a plurality of lead frames 140 rather than the single lead frame 140 may be bonded to the first substrate 110, at least three first semiconductor chips 130a may be mounted on the respective lead frames 140, and the respective first semiconductor chips 130a may be wire 135a bonded to different lead frames 140.

Figure 5:
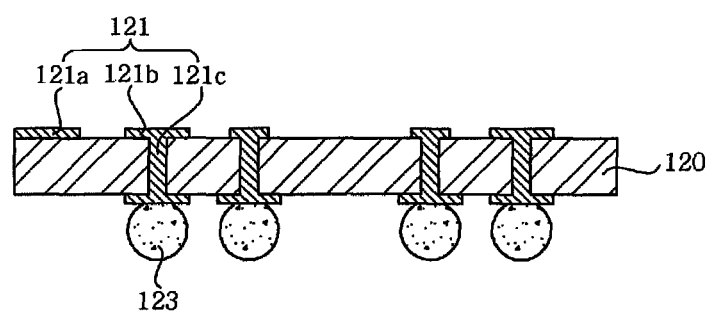

Then, referring to FIG. 5, a second substrate 120 is prepared.

The second substrate 120 may be a printed circuit board (PCB) including a circuit layer 121 including a connection pad 121a, vias 121c, and circuit patterns 121b and external connection terminals 123 formed on the circuit patterns 121b.

According to the present embodiment, the circuit layer 121 may be formed through electro plating or electroless plating but is not specifically limited thereto. In addition, the external connection terminal 123 may be a solder ball but is not specifically limited thereto.

In addition, according to the present embodiment, the connection pad 121a may be formed on one side of an upper surface of the second substrate 120.

Figure 6:
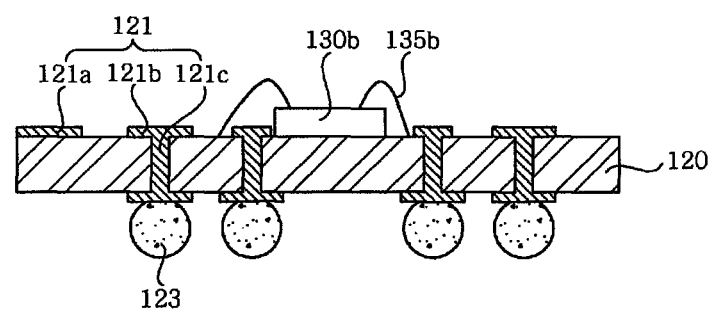

Thereafter, referring to FIG. 6, second semiconductor chips 130b are mounted on the second substrate 120 and the mounted second semiconductor chip 130b and the circuit pattern 121b are then connected to each other through wire 135b bonding.

Here, the second semiconductor chip 130b may be adhered to the second substrate 120 using a separate adhesive member (not shown). Here, the second semiconductor chip 130b may include a low power semiconductor chip for controlling the driving of the above-mentioned high power semiconductor chip, for example, a control device for controlling the power device.

In addition, the second semiconductor chip 130b is rarely connected directly to the via 121c of the second substrate 120, and is generally connected to the circuit pattern 121b connected to the via 121c through the wire 135b bonding.

Further, although FIG. 6 shows that a single second semiconductor chip 130b is mounted on the second substrate 120, at least two second semiconductor chips 130b may be mounted thereon.

Although the present embodiment describes that the first substrate 110 is prepared and the second substrate 120 is then prepared, the present invention is not specifically limited thereto. For example, the first and second substrates 110 and 120 may also be simultaneously prepared, and the second substrate 120 may also be first prepared and the first substrate 110 be then prepared.

Figure 7:
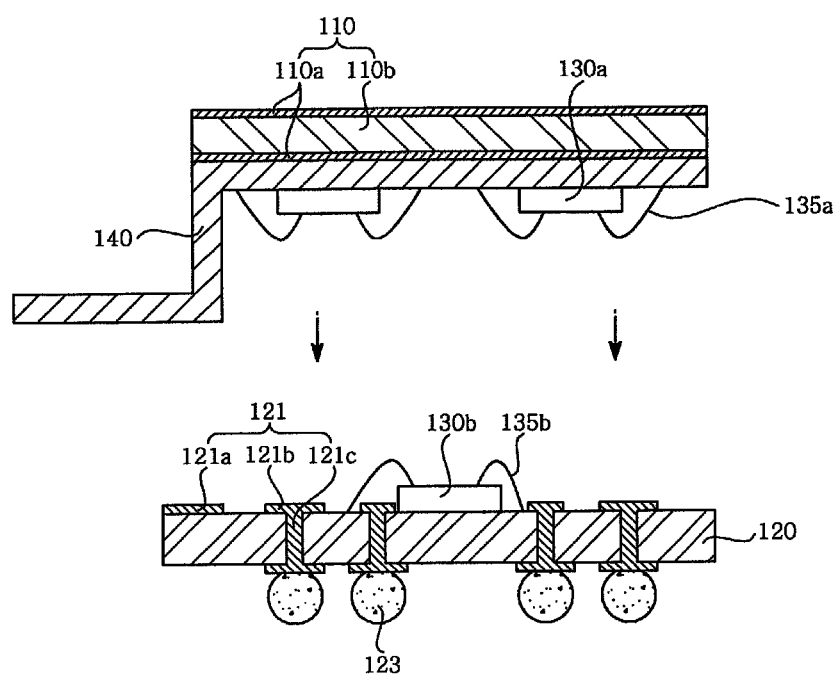
Figure 8:
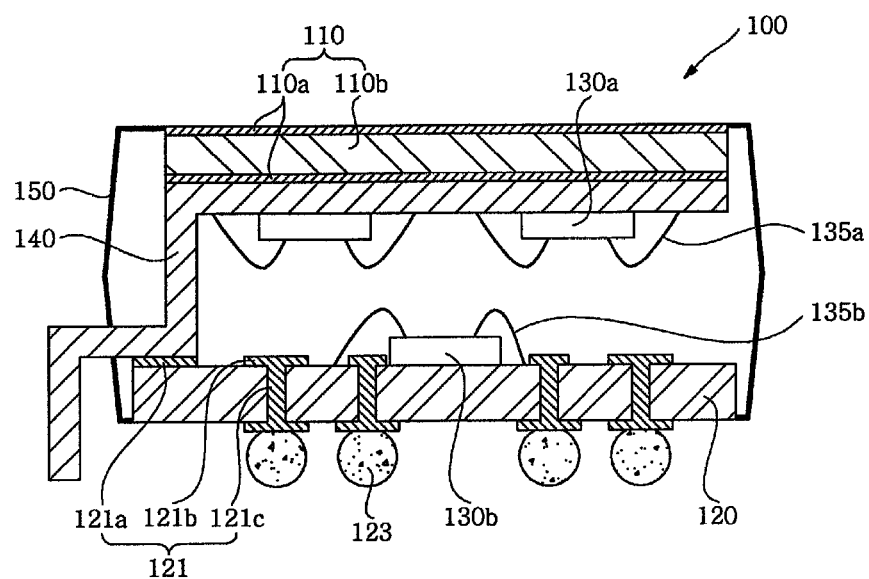

Next, as shown in FIG. 7, the first substrate 110 having the first semiconductor chip 130a mounted thereon and the second substrate 120 having the second semiconductor chip 130b are disposed to face each other so that the first and second semiconductor chips 130a and 130b face each other. Then, as shown in FIG. 8, the other end of the lead frame 140 bonded to the first substrate 110 and the connection pad 121a formed on one side of the upper surface of the second substrate 120 are bonded to each other.

At this time, the other end of the lead frame 140 and the connection pad 121 of the second substrate 120 may be bonded to each other through soldering.

As described above, the first and second substrates 110 and 120 are vertically connected to each other using the lead frame 140 to thermally separate the first semiconductor chip 130a, which is the high power semiconductor chip, and the second semiconductor chip 130b, which is the low power semiconductor chip, from each other, thereby making it possible to minimize an influence of heat generated from the high power semiconductor chip on the low power semiconductor chip.

In addition, each of the first semiconductor chip 130a, which is the high power semiconductor chip, and the second semiconductor chip 130b, which is the low power semiconductor chip, is separately manufactured on a heat radiation substrate and a printed circuit board to reduce the use of an expensive heat radiation substrate, thereby making it possible to reduce a product cost.

Next, as shown in FIG. 8, the method for manufacturing a power module package according to the present embodiment may further include forming a sealing resin 150 enclosing from a side of the first substrate 110 to a side of the second substrate 120, wherein the first and second substrates 110 and 120 are vertically connected to each other by the lead frame 140.

The sealing resin 150 is to protect the wires 135a and 135b and the first and second semiconductor chips 130a and 130b from an external environment. As a material of the sealing resin 150, an epoxy molding compound (EMC), or the like, may be used. However, the material of the sealing resin is not specifically limited thereto.

Thereafter, as shown in FIG. 8, a general subsequent process including a trim/forming process may be performed on the other end of the lead frame 140 protruded outside the sealing resin 150.

Second Preferred Embodiment

FIGS. 9 to 14 are process cross-sectional views sequentially showing a method for manufacturing a power module package according to a second preferred embodiment of the present invention.

In the present embodiment, the same reference numerals will be used to describe the same components as the components described in the first preferred embodiment. In addition, a description of components overlapped with the components described in the first preferred embodiment will be omitted.

Figure 9:
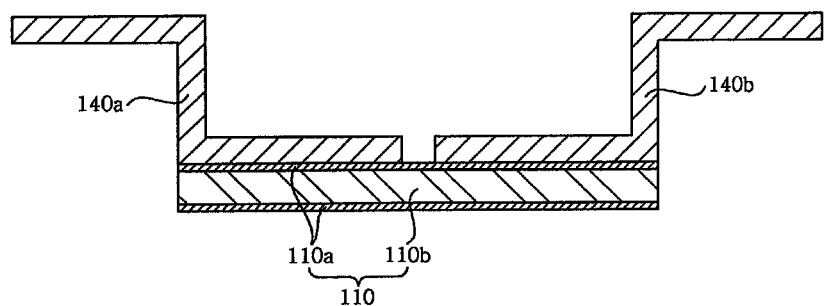
FIGS. 9 to 14 are process cross-sectional views sequentially showing a method for manufacturing a power module package according to a second preferred embodiment of the present invention.

First, referring to FIG. 9, a first substrate 110 having lead frames 140a and 140b bonded thereto is prepared.

According to the present embodiment, as shown in FIG. 9, one ends of a pair of lead frames 140a and 140b are bonded to the first substrate 110.

Here, the other ends of each of the pair of lead frames 140a and 140b having one ends bonded to the first substrate 110 may have a down-set form but is not specifically limited thereto.

In addition, although FIG. 9 shows that the pair of lead frames 140a and 140b is bonded to the first substrate 110, it is obvious that several pair of lead frames 140a and 140b may be bonded thereto.

Further, the pair of lead frames 140a and 140b may be bonded to the first substrate 110 so as to be spaced apart from each other or be bonded to the first substrate 110 so as to be connected to each other.

Figure 10:
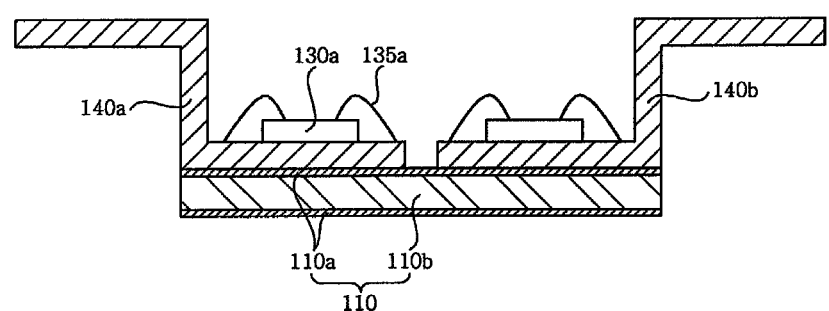

Next, referring to FIG. 10, the first semiconductor chips 130a are mounted on the pair of lead frames 140a and 140b bonded to the first substrate 110.

Here, although FIG. 10 shows that a single first semiconductor chip 130a is mounted on each of the lead frames 140a and 140b, a plurality of first semiconductor chips 130a may also be mounted thereon.

Figure 11:
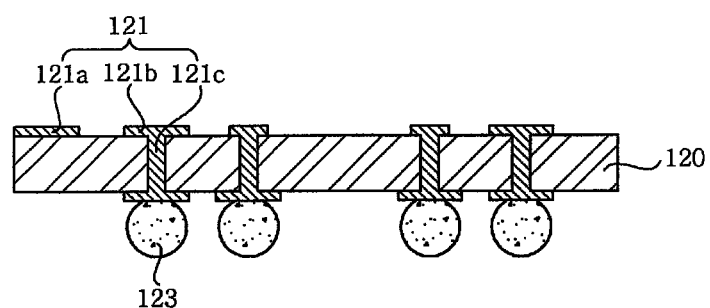

Then, referring to FIG. 11, a second substrate 120 is prepared.

Here, the second substrate 120 may be a printed circuit board provided with a circuit layer 121 including connection pads 121a formed on both sides of one surface thereof, for example, an upper surface, vias 121c, and circuit patterns 121b. In addition, although FIG. 11 shows that the second substrate 120 is a single-layer printed circuit board for simplification of the drawing, the second substrate 120 may be a single layer or multi-layer printed circuit board.

Here, external connection terminals 123 may be formed on the circuit patterns 121b on a lower portion of the second substrate 120. The external connection terminal 123 may be a solder ball.

Figure 12:
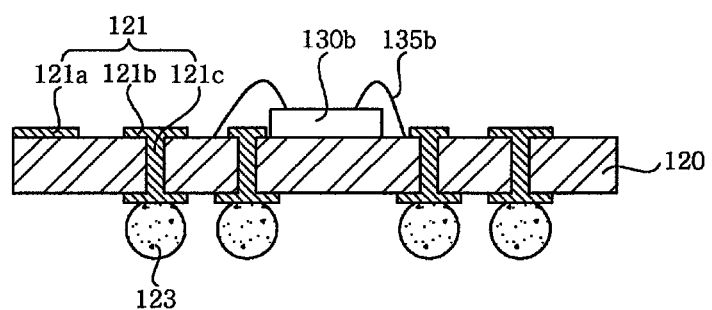

Thereafter, referring to FIG. 12, second semiconductor chips 130b are mounted on the second substrate 120.

Figure 13:
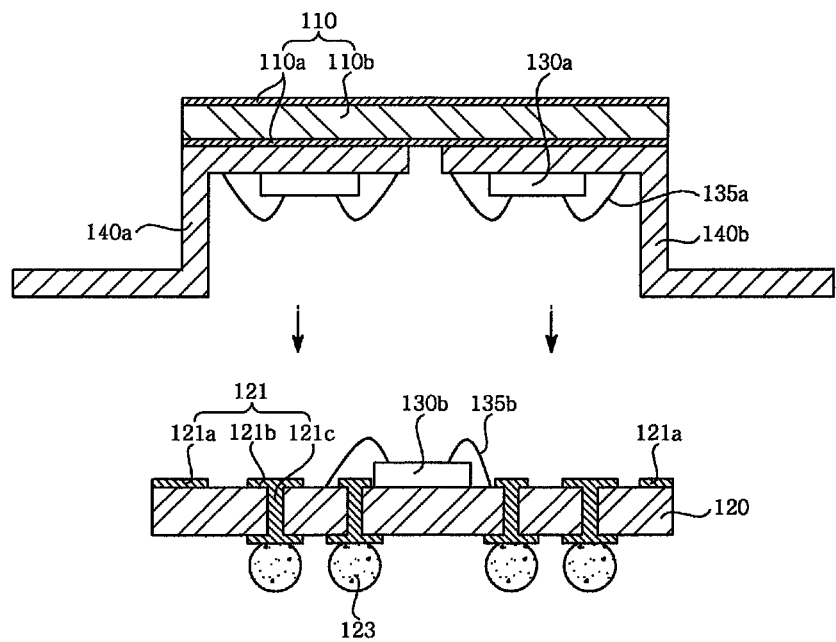

Next, as shown in FIG. 13, the first substrate 110 having the first semiconductor chip 130a mounted thereon and the second substrate 120 having the second semiconductor chip 130b are disposed to face each other so that the first and second semiconductor chips 130a and 130b face each other. Then, as shown in FIG. 14, the other ends of the lead frames 140a and 140b bonded to the first substrate 110 and the connection pads 121a formed on both sides of the upper surface of the second substrate 120 are bonded to each other to thereby vertically connect the first and second substrates 110 and 120 to each other.

As described above, both sides of the first and second substrates 110 and 120 are vertically connected to each other by the pair of lead frames 140a and 140b, thereby making it possible to further improve mechanical stability as compared to the method of bonding only one sides of the first and second substrates 110 and 120 to each other to thereby vertically connect the first and second substrates 110 and 120 to each other according to the above-mentioned first preferred embodiment.

Figure 14:
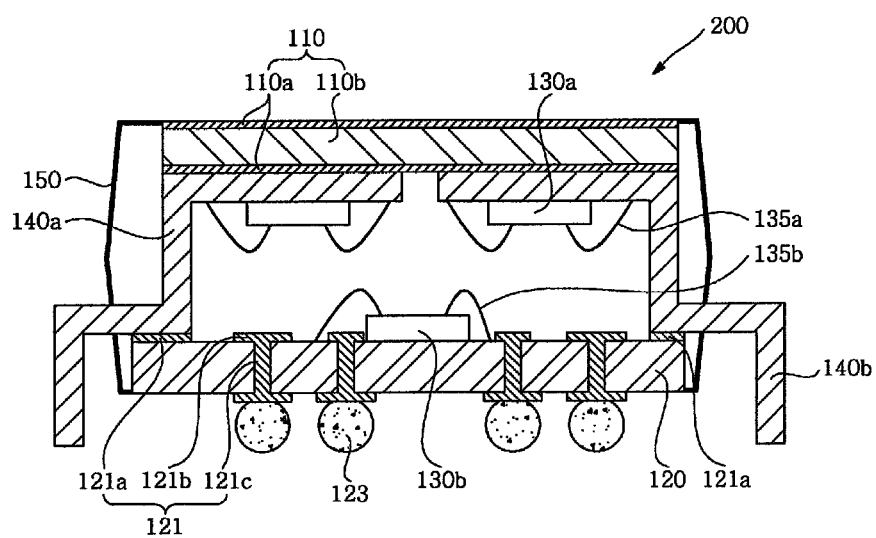

Thereafter, as shown in FIG. 14, an operation of forming a sealing resin 150 enclosing from a side of the first substrate 110 to a side of the second substrate 120 and a general subsequent process including a trim/forming process on the other ends of the lead frames 140a and 140b protruded outside the sealing resin 150 may be performed, wherein the first and second substrates 110 and 120 are vertically connected to each other by the lead frames 140a and 140b.

As set forth above, according to the preferred embodiments of the present invention, the power device and the control device are separated from each other in a three-dimensional structure to minimize an influence of the heat generated from the power device on the control device, thereby making it possible to prevent the control device from being damaged.

In addition, according to the preferred embodiments of the present invention, the power unit having the power device mounted therein and the control unit having the control device mounted therein are disposed in a three dimensional structure to miniaturize a size of a product based on a plane, thereby making it possible to reduce an area occupied by the power module package on a main board.

Further, according to the preferred embodiments of the present invention, only the power device is mounted on the expensive heat radiation substrate, and the control device is mounted on a separate printed circuit board to reduce a size of the used heat radiation substrate, thereby making it possible to reduce a product cost.

Furthermore, according to the preferred embodiments of the present invention, the control unit having the control device mounted therein may be electrically connected to the main board through the via and the external connection terminals to reduce the use of the lead frame, thereby making it possible to reduce a product cost.

Although the preferred embodiments of the present invention have been disclosed for illustrative purposes, they are for specifically explaining the present invention and thus a power module package and a method for manufacturing the same according to the present invention are not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A power module package comprising:
   a first substrate;
   a second substrate having a pad for connection to the first substrate formed on one side or both sides of one surface thereof and having external connection terminals for connection to the outside formed on the other surface thereof;
   a lead frame having one end bonded to the first substrate and the other end bonded to the pad of the second substrate to thereby vertically connect the first and second substrates to each other;
   first semiconductor chips mounted on the lead frame bonded to the first substrate; and
   second semiconductor chips mounted on the second substrate.

2. The power module package as set forth in claim 1, wherein the other end of the lead frame is bonded to the pad formed on one side of one surface of the second substrate.

3. The power module package as set forth in claim 1, wherein
   the lead frame comprises a first lead frame and a second lead frame,
   one end of the first lead frame and one end of the second lead frame are bonded to an upper surface of the first substrate and spaced apart from each other, and
   an other end of the first lead frame and an other end of the second lead frame, respectively, are bonded to connection pads formed on both sides of an upper surface of the second substrate.

4. The power module package as set forth in claim 1, wherein the second substrate further includes vias formed so as to be electrically connected to the external connection terminals.

5. The power module package as set forth in claim 1, wherein the other end of the lead frame bonded to the pad of the second substrate has a down-set form.

6. The power module package as set forth in claim 1, wherein the other end of the lead frame and the pad of the second substrate are bonded to each other through soldering.

7. The power module package as set forth in claim 1, wherein the first semiconductor chip is a power device, and the second semiconductor chip is a control device for controlling the driving of the power device.

8. The power module package as set forth in claim 1, wherein the first substrate is a metal substrate having anodized layers.

9. The power module package as set forth in claim 1, wherein the second substrate is a printed circuit board (PCB).

10. The power module package as set forth in claim 1, further comprising a sealing resin formed to enclose from a side of the first substrate to a side of the second substrate, wherein the first and second substrates are connected to each other by the lead frame.

11. A method for manufacturing a power module package, the method comprising:
    preparing a first substrate to which one end of a lead frame is bonded;
    mounting first semiconductor chips on the lead frame bonded to the first substrate;
    preparing a second substrate having a pad for connection to the first substrate formed on one side or both sides of one surface thereof and having external connection terminals for connection to an outside formed on an other surface thereof; and vertically connecting the first and second substrates to each other by bonding an other end of the lead frame and the pad of the second substrate to each other.

12. The method as set forth in claim 11, wherein the vertically connecting of the first and second substrates is performed by bonding the other end of the lead frame and the pad formed on one side of the second substrate to each other.

13. The method as set forth in claim 11, wherein the vertically connecting of the first and second substrates is performed by bonding the other end of the lead frame and the pads formed on both sides of the second substrate to each other.

14. The method as set forth in claim 11, wherein the preparing of the second substrate further includes forming vias electrically connected to the external connection terminals in the second substrate.

15. The method as set forth in claim 11, further comprising, after the preparing of the second substrate, mounting second semiconductor chips on an upper portion of the second substrate.

16. The method as set forth in claim 11, further comprising, after the vertically connecting of the first and second substrates, forming a sealing resin enclosing from a side of the first substrate to a side of the second substrate.

17. The method as set forth in claim 11, wherein the first substrate is a metal substrate having anodized layers.

18. The method as set forth in claim 11, wherein the second substrate is a printed circuit board (PCB).

19. A power module package comprising:
a first substrate;
a second substrate having a pad for connection to the first substrate formed on one side or both sides of one surface thereof and having external connection terminals for connection to the outside formed on the other surface thereof; and
a lead frame having one end bonded to the first substrate and the other end bonded to the pad of the second substrate to thereby vertically connect the first and second substrates to each other,
wherein the first substrate is a metal substrate having anodized layers.

20. A method for manufacturing a power module package, the method comprising:
preparing a first substrate to which one end of lead frame is bonded;
preparing a second substrate having a pad for connection to the first substrate formed on one side or both sides of one surface thereof and having external connection terminals for connection to the outside formed on the other surface thereof; and
vertically connecting the first and second substrates to each other by bonding the other end of the lead frame and the pad of the second substrate to each other,
wherein the first substrate is a metal substrate having anodized layers.

21. A method for manufacturing a power module package, the method comprising:
preparing a first substrate to which one end of lead frame is bonded;
preparing a second substrate having a pad for connection to the first substrate formed on one side or both sides of one surface thereof and having external connection terminals for connection to the outside formed on the other surface thereof;
vertically connecting the first and second substrates to each other by bonding the other end of the lead frame and the pad of the second substrate to each other; and
forming a sealing resin enclosing from a side of the first substrate to a side of the second substrate.

* * * * *